United States Patent
Lim et al.

(10) Patent No.: US 12,123,922 B2
(45) Date of Patent: Oct. 22, 2024

(54) METHOD AND APPARATUS FOR DETECTING INTERNAL SHORT CIRCUIT IN BATTERY

(71) Applicant: SAMSUNG ELECTRONICS CO., LTD., Suwon-si (KR)

(72) Inventors: Ju Wan Lim, Suwon-si (KR); Jinho Kim, Yongin-si (KR); Myeongjae Lee, Seoul (KR); Young Hun Sung, Hwaseong-si (KR); Duk Jin Oh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 228 days.

(21) Appl. No.: 17/826,958

(22) Filed: May 27, 2022

(65) Prior Publication Data

US 2023/0184845 A1  Jun. 15, 2023

(30) Foreign Application Priority Data

Dec. 15, 2021 (KR) .................. 10-2021-0180015

(51) Int. Cl.
*G01R 31/392* (2019.01)
*B60L 58/10* (2019.01)
(Continued)

(52) U.S. Cl.
CPC ............ *G01R 31/392* (2019.01); *B60L 58/10* (2019.02); *G01R 31/367* (2019.01); *G01R 31/52* (2020.01)

(58) Field of Classification Search
CPC .... G01R 31/392; G01R 31/367; G01R 31/52; B60L 58/10
(Continued)

(56) References Cited

U.S. PATENT DOCUMENTS

| 10,365,312 B2* | 7/2019 | Friedrich ............... G01R 31/52 |
| 2005/0017687 A1* | 1/2005 | Nagaoka ............... H02J 7/0048 |
| | | 320/132 |

(Continued)

FOREIGN PATENT DOCUMENTS

| EP | 3 168 632 B1 | 5/2015 |
| EP | 3 432 016 A1 | 11/2016 |

(Continued)

OTHER PUBLICATIONS

Extended European Search Report Issued on Apr. 19, 2023, in Counterpart European Patent Application No. 22186226.1 (9 Pages in English).

*Primary Examiner* — Tung X Nguyen
*Assistant Examiner* — Trung Q Nguyen
(74) *Attorney, Agent, or Firm* — NSIP Law

(57) ABSTRACT

A method and apparatus for detecting an internal short circuit in a battery are provided. The method includes acquiring values of one or more basic parameters of the battery, acquiring values of one or more degradation parameters used in a battery model indicating an internal state of the battery based on the values of the one or more basic parameters, determining whether the internal short circuit occurs in the battery based on a first value of a first degradation parameter and a second value of a second degradation parameter from among the one or more degradation parameters, and performing an operation in response to the internal short circuit occurring in the battery.

23 Claims, 9 Drawing Sheets

(51) Int. Cl.
  *G01R 31/367* (2019.01)
  *G01R 31/52* (2020.01)
(58) Field of Classification Search
  USPC .................................................. 324/425–434
  See application file for complete search history.

(56) References Cited

U.S. PATENT DOCUMENTS

| | | |
|---|---|---|
| 2011/0060538 A1 | 3/2011 | Fahimi et al. |
| 2018/0196107 A1 | 7/2018 | Fleischer et al. |
| 2018/0328998 A1 | 11/2018 | Zhang et al. |
| 2020/0083572 A1 | 3/2020 | Wang et al. |
| 2020/0313152 A1* | 10/2020 | Stefanopoulou .... H01M 50/578 |
| 2021/0103000 A1 | 4/2021 | Fujino et al. |
| 2022/0196756 A1* | 6/2022 | Liu .................... H01M 10/425 |
| 2022/0200293 A1 | 6/2022 | Lee et al. |

FOREIGN PATENT DOCUMENTS

| | | |
|---|---|---|
| KR | 10-2009-0006919 A | 1/2009 |
| KR | 10-2021-0066096 A | 6/2021 |
| KR | 10-2259967 B1 | 6/2021 |
| KR | 10-2022-0089969 A | 6/2022 |

\* cited by examiner

METHOD AND APPARATUS FOR DETECTING INTERNAL SHORT CIRCUIT IN BATTERY

CROSS-REFERENCE TO RELATED APPLICATIONS

This application claims the benefit under 35 USC § 119(a) of Korean Patent Application No. 10-2021-0180015, filed on Dec. 15, 2021, in the Korean Intellectual Property Office, the entire disclosure of which is incorporated herein by reference for all purposes.

BACKGROUND

1. Field

The following description relates to determining a state of a battery, and more particularly, to determining whether an internal short circuit occurs in a battery.

2. Description of Related Art

Battery short circuit not only causes a reduction in efficiency of a battery but is also a safety issue that may cause battery explosion, which is a cause of a battery thermal runaway. Thus, there is a need to ensure safety of the battery by effectively detecting a short circuit before a physical or thermal deformation of the battery increases due to the battery short circuit. To detect the short circuit of the battery, a change in current, voltage, capacity, temperature, and the like may be measured, and a method of using a change in various parameters in an electric circuit model are used. Further, a method for detecting the short circuit for a multi-cell battery pack includes a method of using various deviation values between unit cells of multiple cells.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a processor-implemented method of detecting an internal short circuit in a battery, the method including acquiring values of one or more basic parameters of the battery, acquiring values of one or more degradation parameters used in a battery model indicating an internal state of the battery based on the values of the one or more basic parameters, determining whether the internal short circuit occurs in the battery based on a first value of a first degradation parameter and a second value of a second degradation parameter from among the one or more degradation parameters, and performing an operation in response to the internal short circuit occurring in the battery.

The basic parameters may include any one or any combination of a voltage of the battery, a current supplied by the battery, and a temperature of the battery.

The battery model may include an electro-chemical model or an equivalent-circuit model to which the degradation parameters are applied.

The degradation parameters may include any one or any combination of an electrode balance shift, a capacity of a cathode active material, and a surface resistance of an anode.

The internal state of the battery may include any one or any combination of state of health (SOH), a state of charge (SOC), a cell voltage, a cathode lithium ion concentration distribution, an anode lithium ion concentration distribution, an electrolyte lithium ion concentration distribution, a cathode potential, and an anode potential of the battery.

The first degradation parameter may be an electrode balance shift, and the second degradation parameter may be a surface resistance of an anode.

The first value of the first degradation parameter may be based on converting a value of the electrode balance shift into a state of health (SOH).

The determining of whether the internal short circuit occurs in the battery may include determining a normal range of a value of the second degradation parameter with respect to the first value of the first degradation parameter, determining whether the second value of the second degradation parameter may be a value within the normal range, and determining that the internal short circuit occurs in the battery in response to the second value of the second degradation parameter not being the value within the normal range.

The first degradation parameter may be an electrode balance shift, and the second degradation parameter may be a surface resistance of an anode.

The first degradation parameter may be a surface resistance of an anode, and the second degradation parameter may be an electrode balance shift.

The determining of the normal range of the value of the second degradation parameter with respect to the first value of the first degradation parameter may include determining a minimum normal value of the second degradation parameter with respect to the first value of the first degradation parameter.

The determining of the minimum normal value of the second degradation parameter with respect to the first value of the first degradation parameter may include determining a minimum normal value of the second degradation parameter based on a pre-generated table for a value of the first degradation parameter and a value of the second degradation parameter.

The determining of the minimum normal value of the second degradation parameter with respect to the first value of the first degradation parameter may include determining a minimum normal value of the second degradation parameter based on a pre-defined equation for a value of the first degradation parameter and a value of the second degradation parameter.

The pre-defined equation may define a boundary line between a normal range and an abnormal range of a battery state, and wherein the internal short circuit does not occur in the normal range, and the internal short circuit occurs in the normal range.

The boundary line may be based on a policy of controlling a charge and a discharge of the battery.

The determining of whether the second value of the second degradation parameter may be the value within the normal range may include determining that the second value of the second degradation parameter may not be the value within the normal range in response to the second value of the second degradation parameter being less than the minimum normal value of the second degradation parameter.

The performing of the operation may include outputting a message or signal, in response to the internal short circuit occurring in the battery.

The battery may be included in a mobile terminal.

The battery may be included in a vehicle.

In another general aspect, there is provided an electronic device for detecting an internal short circuit in a battery, the electronic device including a processor configured to acquire values of one or more basic parameters of the battery, acquire values of one or more degradation parameters used in a battery model indicating an internal state of the battery based on the values of the one or more basic parameters, determine whether the internal short circuit occurs in the battery based on a first value of a first degradation parameter and a second value of a second degradation parameter from among the one or more degradation parameters, and perform an operation in response to the internal short circuit occurring in the battery.

In another general aspect, there is provided a vehicle including a sensor configured to capture one or more basic parameters of a battery, a processor configured to execute instructions stored in a non-transitory computer-readable storage medium to configure the processor to acquire the one or more basic parameters from the sensor, acquire values of one or more degradation parameters used in a battery model indicating an internal state of the battery based on the values of the one or more basic parameters, determine whether an internal short circuit occurs in the battery based on a first value of a first degradation parameter and a second value of a second degradation parameter from among the one or more degradation parameters, and output a message to a vehicle control unit (VCU) of the vehicle, in response to the internal short circuit occurring in the battery.

The processor may be configured to suspend charging or discharging of the battery and the VCU may be configured to notify a user, in response to the internal short circuit occurring in the battery.

The processor may be configured to control charging or discharging of the battery based on a level of the internal short circuit, in response to the internal short circuit occurring in the battery.

Other features and aspects will be apparent from the following detailed description, the drawings, and the claims.

Figure 1:
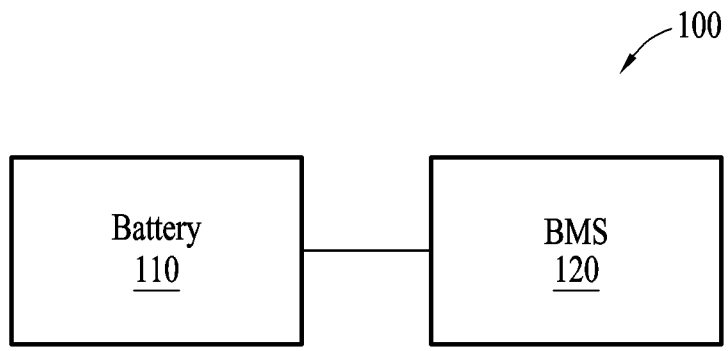
FIG. 1 illustrates an example of a configuration of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the examples. As used herein, the singular forms "a", "an", and "the" are intended to include the plural forms as well, unless the context clearly indicates otherwise. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms used herein including technical or scientific terms have the same meanings as those generally understood consistent with and after an understanding of the present disclosure. Terms, such as those defined in commonly used dictionaries, should be construed to have meanings matching with contextual meanings in the relevant art and the present disclosure, and are not to be construed as an ideal or excessively formal meaning unless otherwise defined herein.

The use of the term "may" herein with respect to an example or embodiment (e.g., as to what an example or embodiment may include or implement) means that at least one example or embodiment exists where such a feature is included or implemented, while all examples are not limited thereto.

When describing the examples with reference to the accompanying drawings, like reference numerals refer to like components and a repeated description related thereto will be omitted. When it is determined detailed description related to a related known function or configuration they may make the purpose of the examples unnecessarily ambiguous in describing the examples, the detailed description will be omitted here.

In addition, terms such as first, second, third, A, B, C, (a), (b), (c), and the like may be used herein to describe components. Each of these terminologies is not used to define an essence, order or sequence of a corresponding component but used merely to distinguish the corresponding component from other component(s). It should be noted that if it is described in the specification that one component is "connected", "coupled", or "joined" to another component, a third component may be "connected", "coupled", and "joined" between the first and second components, although the first component may be directly connected, coupled or joined to the second component.

The same name may be used to describe an element included in the examples described above and an element having a common function. Unless otherwise mentioned, the descriptions on the examples may be applicable to the following examples and thus, duplicated descriptions will be omitted for conciseness.

FIG. 1 illustrates an example of a configuration of a battery system 100.

According to an example, a battery 110 may be one or more battery cells, battery modules or battery packs. The battery 110 may include a condenser, a secondary cell or a lithium-ion cell that stores power by a charging. An apparatus with the battery 110 may receive power supplied from the battery 110.

A battery management system (BMS) 120 may charge the battery 110 using a battery model. For example, the BMS 120 may fast charge the battery 110 using a multi-step charging scheme for minimizing a charging degradation by using a value obtained by estimating an internal state of the battery based on the battery model. In this example, the battery model may estimate state information of the battery 110 by modeling an internal physical phenomenon, such as a potential of the battery 110 or an ion concentration distribution, and may be an electro-chemical model or an equivalent-circuit model to which degradation parameters of the battery 110 are applied. Further, the internal state of the battery 110 may include one or more of a cathode lithium ion concentration distribution, an anode lithium ion concentration distribution, an electrolyte lithium ion concentration distribution, a cathode potential and an anode potential of the battery 110. For example, the degradation parameters may include one or more of an electrode balance shift (hereinafter, referred to as an "EBS"), a capacity of a cathode active material, and a surface resistance of an anode of the battery 110, and there is no limitation thereto.

The BMS 120 may divide a charging process into a plurality of charging sections (or steps), and charge the battery 110 with a charging current corresponding to each of the charging sections. A charging limit condition for limiting a charging of the battery 110 may be set in each of the plurality of charging sections, in order to prevent a degradation of the battery 110 and to charge the battery 110 to a target charging capacity during a target charging time.

For example, the charging limit condition may include internal state conditions of the battery 110 for each of the charging sections. An internal state condition may be defined from the electro-chemical model based on at least one internal state that has an influence on the degradation of the battery 110. The internal state condition may include any one or any combination of an anode overpotential condition, a cathode overpotential condition, an anode surface lithium ion concentration condition, a cathode surface lithium ion concentration condition, a cell voltage condition, and a state of charge (SOC) condition.

The degradation of the battery 110 may be derived if the battery 110 reaches one of the internal state conditions in response to the battery 110 being changed, and thus the BMS 120 may control a charging of the battery 110 based on the internal state conditions. For example, when it is determined that the battery 110 is degraded in response to an anode overpotential of the battery 110 falling to 0.05 volt (V) or less, the anode overpotential condition may be set based on 0.05 V. A degradation condition may be a condition that causes a degradation in response to the internal state of the battery 110 reaching the degradation condition. An anode overpotential of 0.05 V may be a degradation condition that causes the degradation if the anode overpotential reaches 0.05 V. However, the internal state condition is not limited to the above examples, and various expressions that quantify an internal state having an influence on the degradation of the battery 110 may be used.

An overpotential may be a voltage drop due to a deviation from an equilibrium potential associated with intercalation/de-intercalation reactions at each electrode of the battery 110. The above-described lithium ion concentration may be a concentration of lithium ions used as a material in an active material of each electrode of the battery 110, and materials other than the lithium ions may be used as materials in the active material.

The SOC may be a parameter indicating a charging state of the battery 110. Since the SOC indicates a level of energy stored in the battery 110, an amount of the SOC may be expressed as 0 to 100% using a percentage unit. For example, 0% may be a fully discharged state, and 100% may be a fully charged state. Such expressions may be variously modified and defined depending on a design intent or examples. Various schemes may be employed to estimate or measure the SOC.

The battery 110 may include two electrodes (e.g., a cathode and an anode) from which lithium ions are intercalated/de-intercalated, an electrolyte that is a medium in which the lithium ions may move, a separator that physically separates the cathode from the anode to prevent electrons from flowing directly and to allow ions to pass, and a collector that collects electrons generated by an electrochemical reaction or supplies electrons required for an electrochemical reaction. The cathode may include an active material of the cathode, and the anode may include an active material of the anode. For example, $LiCoO_2$ may be used as the active material of the cathode, and a graphite ($C_6$) may be used as the active material of the anode. During charging of the battery 110, lithium ions may move from the cathode to the anode, and during discharging of the battery 110, lithium ions may move from the anode to the cathode, and thus a concentration of lithium ions included in the active material of the cathode and a concentration of lithium ions included in the active material of the anode may change depending on the charging and discharging.

To express the internal state of the battery 110, an electro-chemical model may be employed using various schemes. For example, various application models as well as a single particle model (SPM) may be employed as an electro-chemical model, and parameters that define the electro-chemical model may be variously modified depending on a design intent. The internal state condition may be derived from the electro-chemical model of the battery 110, or may be experimentally or heuristically derived. A scheme of defining the internal state condition is not limited.

According to an example, the BMS 120 may control charging and discharging of the battery 110, and determine (or estimate) a state of the battery 110. For example, the BMS 120 may determine whether an internal short circuit occurs in the battery 110. If the battery 110 is repeatedly used, the degradation may be gradually increased, and an internal short circuit may occur in the battery 110 due to the degradation of the battery 110. For example, if the separator is pierced by dendrites piled up on a surface of the anode, the internal short circuit may occur in the battery 110. For example, a short circuit may be a micro resistance having a resistance value of 200 ohm (Ω) or less.

For example, if it is determined that a short circuit occurs in the battery 110, the BMS 120 may suspend charging or discharging of the battery 110, and notify a user of the state of the battery 110. In another example, if it is determined that a short circuit occurs in the battery 110, the BMS 120 may control charging or discharging of the battery 110 based on a level of the short circuit.

Hereinafter, a method of determining whether an internal short circuit occurs in a battery will be described in detail with reference to FIGS. 2 through 8.

Figure 2:
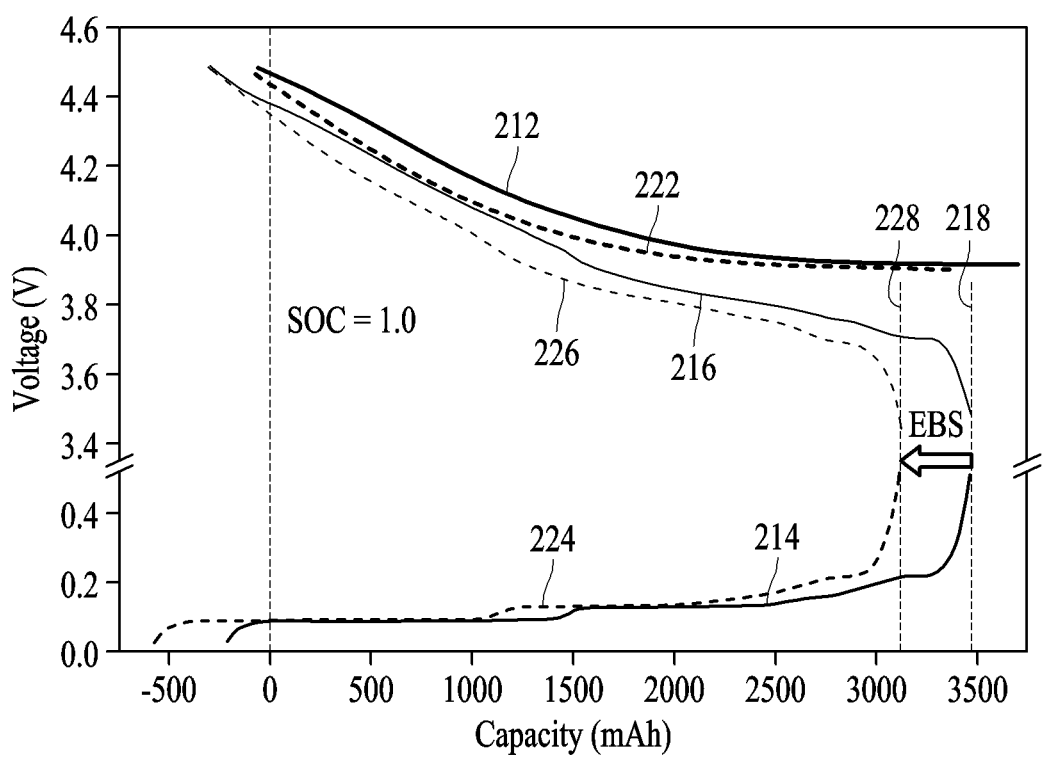
FIG. 2 illustrates an example of an electrode balance shift due to a degradation of a battery.

FIG. 2 illustrates an example of an EBS due to a degradation of a battery.

As a battery is degraded, one or more degradation parameters used in a battery model may change. For example, a change in a degradation parameter may be an EBS due to a side reaction on a surface of an anode. In another example, a change in a degradation parameter may be an increase in a direct current (DC) resistance value. The increase in the DC resistance value may be caused by an increase in a solid electrolyte interface (SEI) on an anode surface, an increase in a cathode-electrolyte interface (CEI) on a cathode surface, an increase in an ionic resistance caused by a decrease in a porosity in an electrode layer and an increase in a tortuosity due to byproducts of a side reaction on an electrode surface, or an oxidation of a collector in an electrode. In another example, a change in a degradation parameter may be a decrease in a cathode capacity. The degradation parameters are not limited to the above examples.

According to an example, the EBS may have a greatest influence on a decrease in a capacity of the battery, among the degradation parameters. The EBS may be a phenomenon in which a charge balance between the cathode and the anode changes because ions fail to move from a cathode to an anode due to an occurrence of a side reaction such as an SEI generation reaction on the anode surface.

For example, a potential graph 212 of a cathode, a potential graph 214 of an anode, and a battery voltage 216 according to a capacity of a battery before a degradation of the battery are illustrated, and a potential graph 222 of a cathode, a potential graph 224 of an anode, and a battery voltage 226 according to a capacity of a battery after a degradation of the battery are illustrated. If the battery is degraded, a potential of the anode may change relatively greatly in comparison to a potential of the cathode. As the potential of the anode changes, a point of an electrode balance may change from a first point 218 to a second point 228 in terms of a battery capacity.

Figure 3:
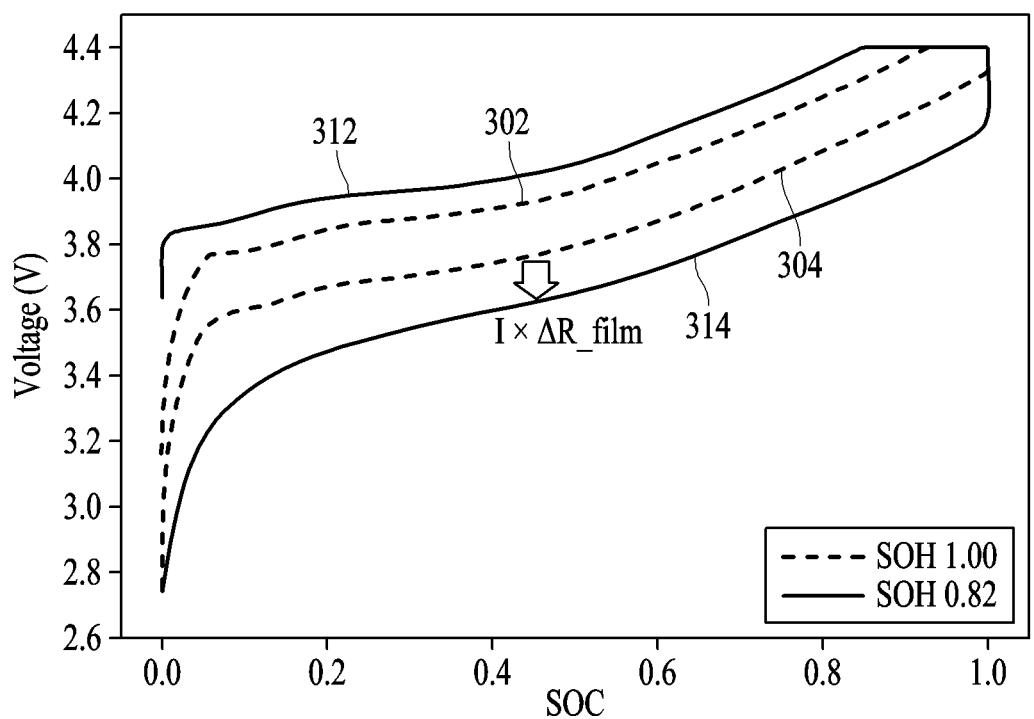
FIG. 3 illustrates an example of a trajectory of a charging voltage and a trajectory of a discharging voltage of a battery according to an increase in resistance of an anode.

FIG. 3 illustrates an example of a trajectory of a charging voltage and a trajectory of a discharging voltage of a battery according to an increase in resistance of an anode.

According to an example, a trajectory of a charging voltage and a trajectory of a discharging voltage of a battery may vary depending on a level of a degradation of the battery. For example, a trajectory 302 of a charging voltage and a trajectory 304 of a discharging voltage in response to a state of health (SOH) of the battery being "1" are illustrated, and a trajectory 312 of a charging voltage and a trajectory 314 of a discharging voltage of a battery in response to an SOH of the battery being "0.82" are illustrated. The SOH may be a parameter that quantitatively indicates a change in a life time characteristic of a battery due to a degradation phenomenon, and may indicate a level of degradation in a life time or a capacity of the battery. For example, the SOH may have a value between "0" and "1", and a value of "1" may represent a maximum life time or a maximum capacity of the battery. Various schemes may be employed to estimate or measure the SOH.

For example, a surface resistance R_film (or, a DC resistance) of an anode may change in response to the battery being degraded. An increase in the surface resistance of the anode may have the same influence as a decrease in a capacity of the battery by allowing an output voltage to reach a cut-off voltage earlier during discharging of the battery.

Figure 4:
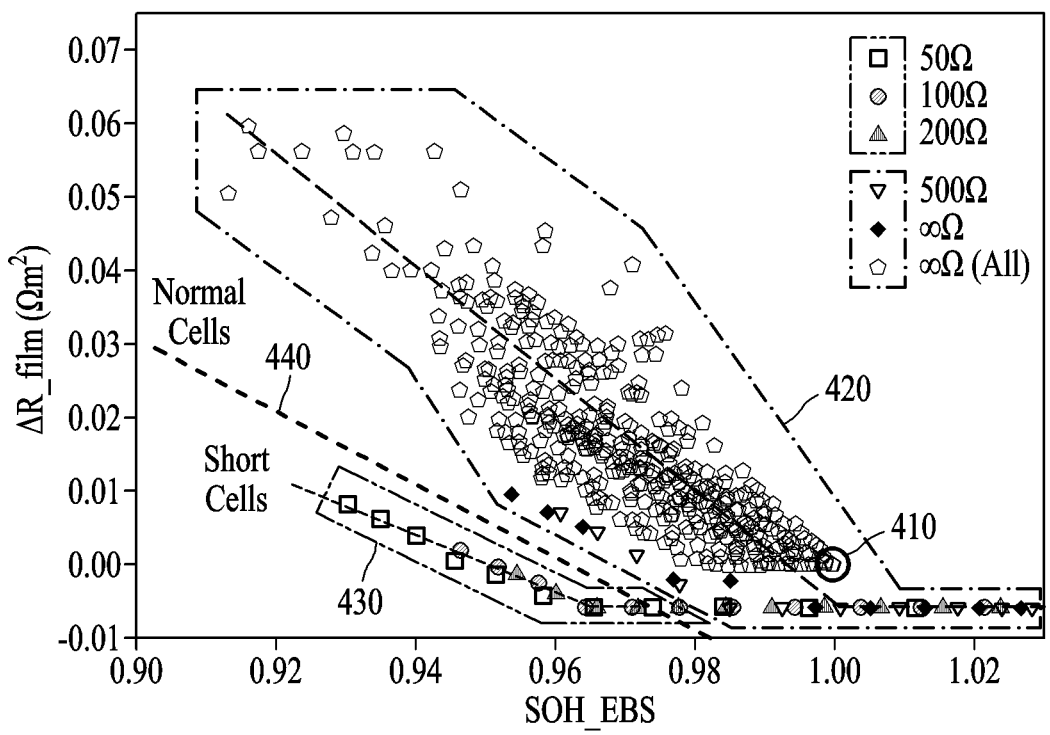
FIG. 4 illustrates an example of a value of an electrode balance shift and a value of a surface resistance of an anode that are represented for a resistance value of a battery.

FIG. 4 illustrates an example of a value of an EBS and a value of a surface resistance of an anode that are represented for a resistance value of a battery.

According to an example, an increase in a DC resistance value may be differently expressed as an increase in a value of a surface resistance of an anode, an increase in a value of a surface resistance of a cathode, an increase in a value of an electric resistance, a decrease in a porosity of an anode, an increase in a tortuosity, or an increase in a level of oxidation of a collector.

According to an example, an increase in a value of an electrode balance shift (hereinafter, referred to as an "EBS"), may be differently expressed as a decrease in a value of an SOH, or a decrease in a battery capacity.

An x-axis of a graph illustrated in FIG. 4 may represent a value obtained by converting the EBS into the SOH. If SOH_EBS is "1.0", a value of the EBS may be "0". The EBS with the value of "0" may indicate a state in which the battery is not degraded. As the battery is degraded, a value of SOH_EBS may decrease. A y-axis of the graph illustrated in FIG. 4 may represent a value obtained by converting a variation of a DC resistance value into a variation of a value of a surface resistance of an anode. If the variation (ΔR_film) of the value of the surface resistance of the anode is "0", the variation of the DC resistance value may be "0".

According to an example, if a short circuit with a resistance value of 500Ω or greater occurs in the battery, points indicating a value of SOH_EBS and a value of ΔR_film of the battery for a corresponding resistance value may be located in a first area 420. Each of ∞ Ω and ∞ Ω (All) may indicate a state in which the short circuit does not occur in the battery, and may be expressed separately depending on a difference between algorithms that derive a degradation parameter used in a simulation or an experiment for reproducing the short circuit in the battery.

If a short circuit with a resistance value of 200Ω or less occurs in the battery, points indicating a value of SOH_EBS and a value of ΔR_film of the battery for a corresponding resistance value may be located in a second area 430. A boundary line 440 that may distinguish between the first area 420 and the second area 430 may be represented.

According to the graph of FIG. 4, when a short circuit (e.g., a short circuit having a resistance value of 200Ω or less) occurs in the battery, the value of the EBS may be relatively great in comparison to when a short circuit does not occur in the battery, even though a DC resistance value increases by the same amount. In another example, when a short circuit (e.g., a short circuit having a resistance value of 200Ω or less) occurs in the battery, an amount of increase in the DC resistance value may be relatively less in comparison to when a short circuit does not occur in the battery, even though values of the EBS are the same.

According to an example, if a value of SOH_EBS (or an EBS) and a value of ΔR_film (or a DC resistance) are acquired in a current state of the battery, whether a short circuit occurs in a battery may be determined based on the value of SOH_EBS and the value of ΔR_film. Hereinafter, an example of a method of determining whether a short circuit occurs in a battery will be described in detail with reference to FIGS. 5 through 9.

Figure 5:
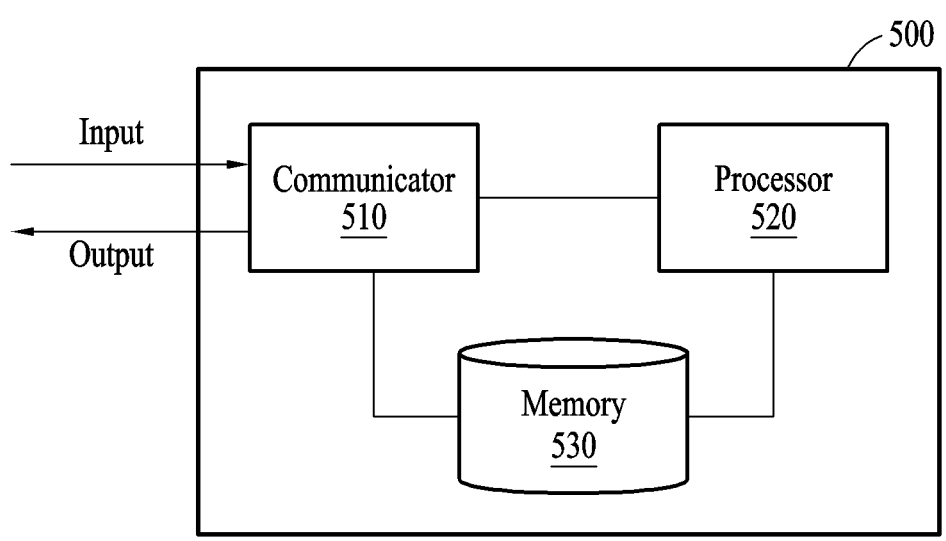
FIG. 5 illustrates an example of a configuration of an electronic device.

FIG. 5 illustrates an example of a configuration of an electronic device.

An electronic device 500 for controlling a battery may include a communicator 510, a processor 520, and a memory 530. For example, the electronic device 500 may correspond to the BMS 120 described with reference to FIG. 1.

According to an example, the electronic device 500 may be included in a mobile communication terminal.

According to an example, the electronic device 500 may be included in a vehicle.

The communicator 510 may be connected to the processor 520 and the memory 530 to transmit and receive data. The communicator 510 may be connected to another external device to transmit and receive data. Hereinafter, the expression "transmitting and receiving 'A'" may represent "transmitting and receiving 'information or data indicating A'".

The communicator 510 may be implemented as a circuitry in the electronic device 500. For example, the communicator 510 may include an internal bus and an external bus. In another example, the communicator 510 may be a component that connects the electronic device 500 and an external device. The communicator 510 may be an interface. The communicator 510 may receive data from the external device, and transmit data to the processor 520 and the memory 530.

The processor 520 may control an overall operation of the electronic device 500 and may execute corresponding processor-readable instructions for performing operations of the electronic device 500. The processor 520 may execute, for example, software, to control one or more hardware components of the electronic device 500 connected to the processor 520 and may perform various data processing or operations, and control of such components.

In an example, as at least a part of data processing or operations, the processor 520 may store instructions or data in the memory 530, execute the instructions and/or process data stored in the memory 530, and store resulting data obtained therefrom in the memory 530. The processor 520 may process data received by the communicator 510. The processor 520 may be a data processing device implemented by hardware including a circuit having a physical structure to perform desired operations. For example, the desired operations may include code or instructions included in a program.

The processor 520 may be a data processing device implemented by hardware including a circuit having a physical structure to perform desired operations. For example, the desired operations may include code or instructions included in a program.

The hardware-implemented data processing device may include, for example, a main processor (e.g., a central processing unit (CPU), a field-programmable gate array (FPGA), or an application processor (AP)) or an auxiliary processor (e.g., a GPU, a neural processing unit (NPU), an image signal processor (ISP), a sensor hub processor, or a communication processor (CP)) that is operable independently of, or in conjunction with the main processor. Further details regarding the processor 520 is provided below.

The processor 520 may execute a computer-readable code (e.g., software) stored in a memory (e.g., the memory 530), and instructions triggered by the processor 520.

The memory 530 may store data received by the communicator 510, and data processed by the processor 520. For example, the memory 530 may store a program (or an application or software). For example, the stored program may be a set of syntaxes that may be coded to generate a charging path of a battery and executable by the processor 520. In another example, the stored program may be a set of syntaxes that may be coded to determine a charging limit condition of a battery and executable by the processor 520.

According to an aspect, the memory 530 may include any one or any combination of a volatile memory and a non-volatile memory.

The volatile memory device may be implemented as a dynamic random-access memory (DRAM), a static random-access memory (SRAM), a thyristor RAM (T-RAM), a zero capacitor RAM (Z-RAM), or a twin transistor RAM (TTRAM).

The non-volatile memory device may be implemented as an electrically erasable programmable read-only memory (EEPROM), a flash memory, a magnetic RAM (MRAM), a spin-transfer torque (STT)-MRAM, a conductive bridging RAM (CBRAM), a ferroelectric RAM (FeRAM), a phase change RAM (PRAM), a resistive RAM (RRAM), a nanotube RRAM, a polymer RAM (PoRAM), a nano floating gate Memory (NFGM), a holographic memory, a molecular electronic memory device), or an insulator resistance change memory. Further details regarding the memory 530 is provided below.

The memory 530 may store an instruction set (e.g., software) to operate the electronic device 500. The instruction set to operate the electronic device 500 may be executed by the processor 520.

The communicator 510, the processor 520, and the memory 530 will be described in detail with reference to FIGS. 6 and 9 below.

Figure 6:
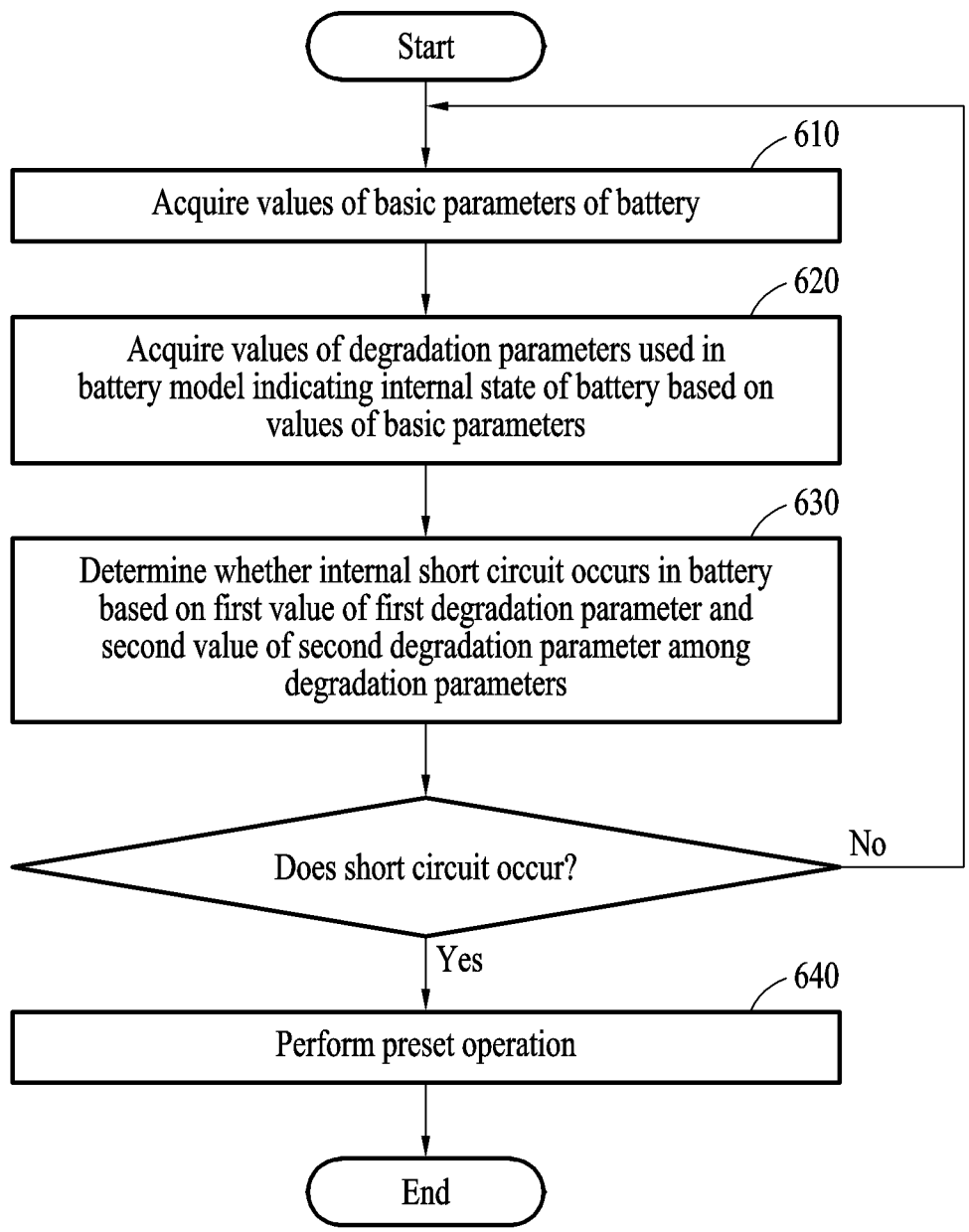
FIG. 6 is a diagram illustrating an example of a method of detecting a short circuit in a battery.

FIG. 6 is a diagram illustrating an example of a method of detecting a short circuit in a battery. The operations in FIG. 6 may be performed in the sequence and manner as shown, although the order of some operations may be changed or some of the operations omitted without departing from the spirit and scope of the illustrative examples described. Many of the operations shown in FIG. 6 may be performed in parallel or concurrently. One or more blocks of FIG. 6, and combinations of the blocks, can be implemented by special purpose hardware-based computer, such as a processor, that perform the specified functions, or combinations of special purpose hardware and computer instructions. For example, operations 610 through 640 below may be performed by the electronic device 500 described with reference to FIG. 5. In addition to the description of FIG. 6 below, the descriptions of FIGS. 1-5 are also applicable to FIG. 6, and are incorporated herein by reference. Thus, the above description may not be repeated here.

In operation 610, the electronic device 500 may acquire values of one or more basic parameters of a battery. For example, the basic parameters may include one or more of a voltage of the battery, a current supplied by the battery, and a temperature of the battery. The temperature of the battery may be a temperature of a surface of the battery or a temperature of an electrode of the battery, and is not limited to the examples described above.

In operation 620, the electronic device 500 may acquire values of one or more degradation parameters used in a battery model indicating an internal state of the battery based on the values of the basic parameters. For example, the battery model may be an electro-chemical model or an equivalent-circuit model.

According to an example, the degradation parameters may include one or more of an EBS, a capacity of a cathode active material, and a surface resistance of an anode. For example, a value of the EBS may be converted into a state of health (SOH) and expressed. For example, a value (or a variation) of a surface resistance R_film of an anode may be expressed based on a DC resistance value.

According to an example, an internal state of a battery that is estimated by a battery model may change by adjusting one or more parameters of a model based on degradation parameters. For example, the internal state of the battery that may be estimated by the battery model may include one or more of a cathode lithium ion concentration distribution, an anode lithium ion concentration distribution, an electrolyte lithium ion concentration distribution, a cathode potential, and an anode potential of the battery.

In operation 630, the electronic device 500 may determine whether an internal short circuit occurs in the battery based on a first value of a first degradation parameter and a second value of a second degradation parameter from among the degradation parameters.

In an example, the first degradation parameter may be the EBS, and the second degradation parameter may be the surface resistance of the anode. In another example, the first degradation parameter may be the surface resistance of the anode, and the second degradation parameter may be the EBS.

According to an example, whether an internal short circuit occurs in the battery may be determined based on a pre-defined equation or graph for values of first degradation parameter and values of second degradation parameter. For example, whether the battery is normal or whether the short circuit occurs may be determined based on a result of an equation that defines a first value and a second value as variables. Hereinafter, the pre-defined equation or graph will be described in detail with reference to FIG. 7.

According to an example, whether an internal short circuit occurs in the battery may be determined based on a pre-generated table for the values of the first degradation parameter and the values of the second degradation parameter. For example, a table in which a state of the battery corresponding to the first value of the first degradation parameter and the second value of the second degradation parameter is defined may be pre-generated. The state of the battery may include a normal state and a short circuit state.

According to an example, whether the internal short circuit occurs in the battery may be determined by determining whether the second value of the second degradation parameter with respect to the first value of the first degradation parameter is within a normal range. An example of a normal range for a value of a degradation parameter will be described in detail with reference to FIGS. 8 and 9 below.

In operation 640, the electronic device 500 may perform a preset operation in response to the internal short circuit occurring in the battery.

According to an example, the preset operation may be an operation of outputting a preset message or signal. For example, the electronic device 500 may output a message through a speaker or a display of the electronic device 500 to notify a user of the short circuit of the battery. The user may recognize a state of the battery based on the output message, and take a follow-up action such as exchanging the battery and the like.

According to an example, the preset operation may be an operation of disconnecting the battery from the electronic device 500 such that the short circuit of the battery does not progress. If the battery and the electronic device 500 are disconnected due to the short circuit, the electronic device 500 may be powered off until the battery is replaced.

Figure 7:
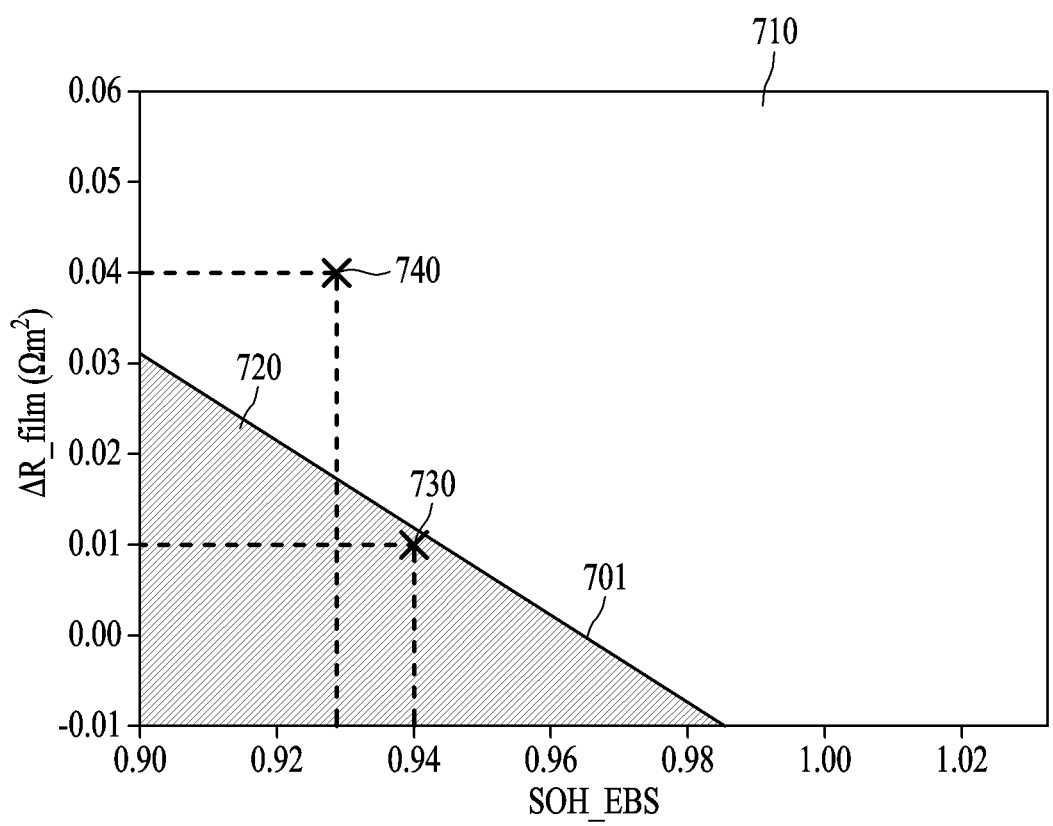
FIG. 7 illustrates an example of a normal range and an abnormal range of a battery state determined by a relationship between values of degradation parameters.

FIG. 7 illustrates an example of a normal range and an abnormal range of a battery state determined by a relationship between values of degradation parameters.

According to an example, a two-dimensional (2D) plane on which an x-axis represents SOH_EBS as a degradation parameter and a y-axis represents $\Delta R\_film$ as a degradation parameter may be defined. For example, a boundary line 701 for distinguishing between a normal range and an abnormal range of a battery state may be defined on the 2D plane. For example, the boundary line 701 may correspond to the boundary line 440 described with reference to FIG. 4.

According to an example, based on the boundary line 701, a first area 710 may indicate that the battery state is in the normal range, and a second area 720 may indicate that the battery state is in the abnormal range. For example, if a point 730 that indicates a first value (e.g., "0.94") of SOH_EBS and a second value (e.g., "0.01") of $\Delta R\_film$ are in the second area 720, the battery state may be determined to be abnormal (e.g., an occurrence of an internal short circuit). In another example, if a point 740 that indicates a first value (e.g., "0.93") of SOH_EBS and a second value (e.g., "0.04") of $\Delta R\_film$ are in the first area 710, the battery state may be determined to be normal (e.g., a non-occurrence of an internal short circuit).

The boundary line 701 may be differently defined for each of batteries. In an example, the boundary line 701 may be defined by a manufacturer of the battery. In another example, the boundary line 701 may be defined by a manufacturer of an electronic device. In another example, the boundary line 701 may change based on a policy of controlling a battery.

According to an example, a table may be pre-generated such that each of pairs (e.g., (x, y)) between values of the x-axis and values of the y-axis illustrated in FIG. 7 may represent a normal state or an abnormal state. For example, the table may be pre-generated such that (0.94, 0.01) corresponding to the point 730 may represent the abnormal state and that (0.93, 0.04) corresponding to the point 740 may represent the normal state.

Figure 8:
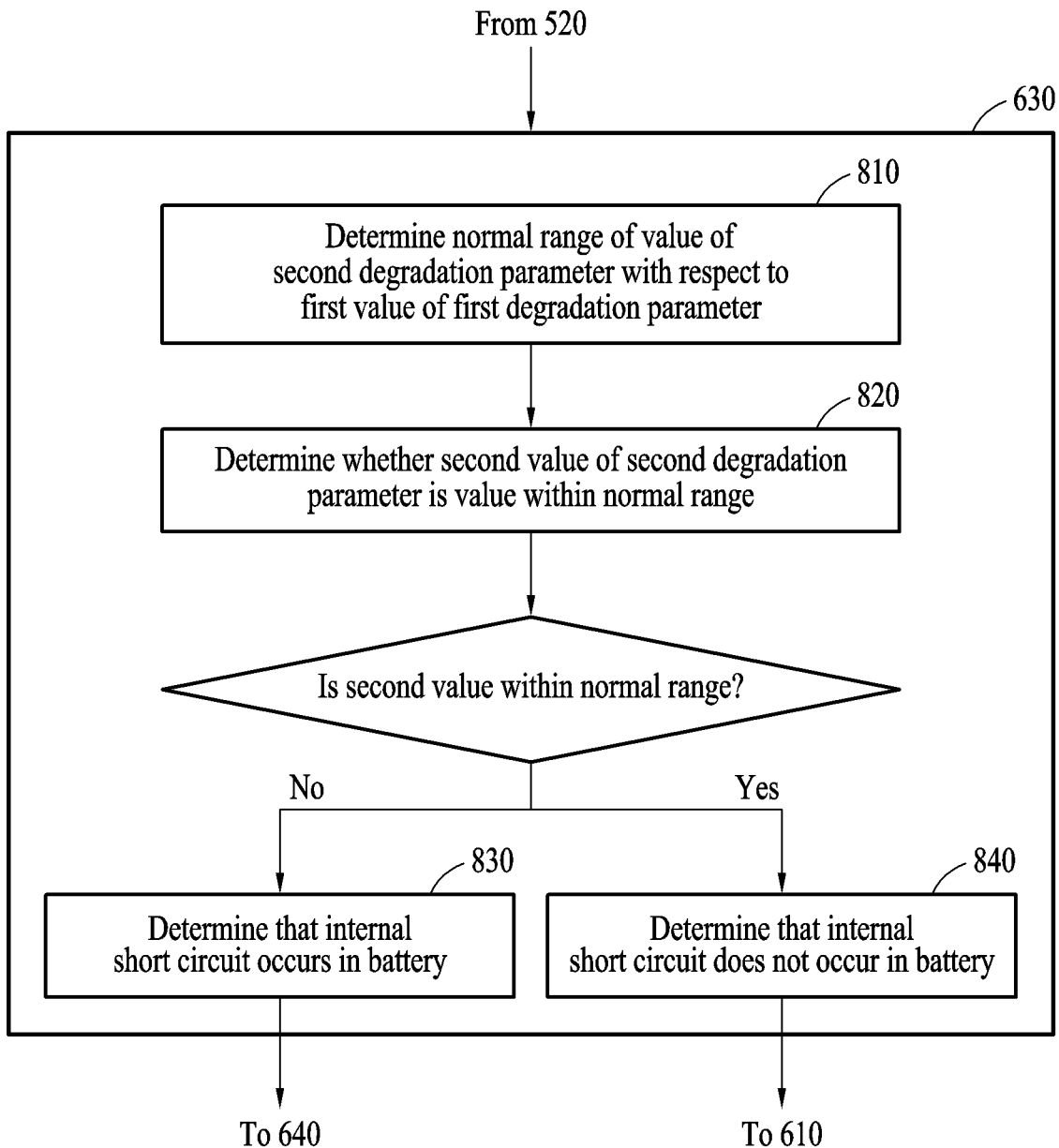
FIG. 8 illustrates an example of a method of determining whether an internal short circuit occurs in a battery based on a first value of a first degradation parameter and a second value of a second degradation parameter.

FIG. 8 illustrates an example of a method of determining whether an internal short circuit occurs in a battery based on a first value of a first degradation parameter and a second value of a second degradation parameter. The operations in FIG. 8 may be performed in the sequence and manner as shown, although the order of some operations may be changed or some of the operations omitted without departing from the spirit and scope of the illustrative examples described. Many of the operations shown in FIG. 8 may be performed in parallel or concurrently. One or more blocks of FIG. 8, and combinations of the blocks, can be implemented by special purpose hardware-based computer, such as a processor, that perform the specified functions, or combinations of special purpose hardware and computer instructions. For example, operations of the method may be performed by a computing apparatus (e.g., the electronic device 700 in FIG. 7). In addition to the description of FIG. 8 below, the descriptions of FIGS. 1-7 are also applicable to FIG. 8, and are incorporated herein by reference. Thus, the above description may not be repeated here.

According to an example, operation 630 described with reference to FIG. 6 may include operations 810 through 840 below.

In operation 810, the electronic device 500 may determine a normal range of a value of a second degradation parameter with respect to a first value of a first degradation parameter.

According to an example, the electronic device 500 may determine a minimum normal value of the second degradation parameter with respect to the first value of the first degradation parameter. In an example, the minimum normal value of the second degradation parameter may be determined based on a pre-generated table for the value of the first degradation parameter and the value of the second degradation parameter. In another example, the minimum normal value of the second degradation parameter may be determined based on a pre-defined equation for the value of the first degradation parameter and the value of the second degradation parameter. For example, the pre-defined equation may be an equation that represents the boundary line 701 described with reference to FIG. 7.

In operation 820, the electronic device 500 may determine whether the second value of the second degradation parameter is a value within the normal range. For example, referring to the 2D plane of FIG. 7, points indicating the first value and the second value may be located in the first area 710 if the second value of the second degradation parameter is equal to or greater than a minimum normal value, and points indicating the first value and the second value may be located in the second area 720 if the second value of the second degradation parameter is less than the minimum normal value.

In operation 830, the electronic device 500 may determine that the internal short circuit occurs in the battery, if the second value of the second degradation parameter is not a value in the normal range.

Figure 9:
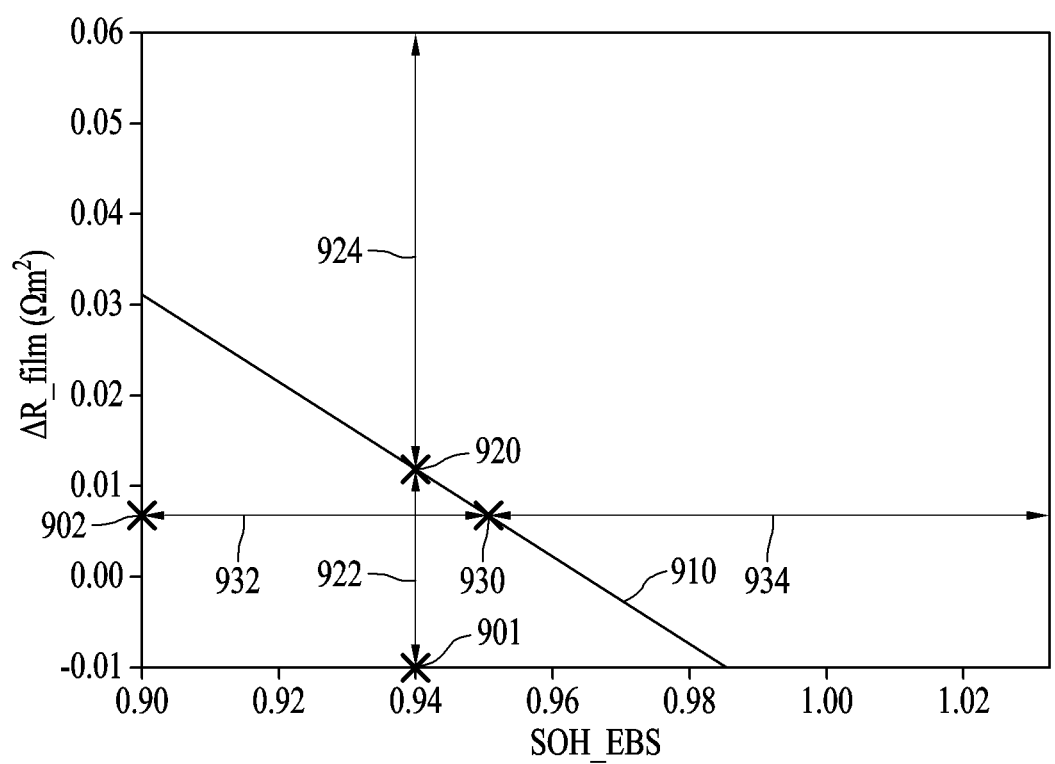
FIG. 9 illustrates an example of a normal range of a value of $\Delta R\_film$ with respect to a target value of $SOH\_EBS$, and a normal range of $SOH\_EBS$ with respect to a target value of a value of $\Delta R\_film$.

FIG. 9 illustrates an example of a normal range of a value of ΔR_film with respect to a target value of SOH_EBS, and a normal range of SOH_EBS with respect to a target value of a value of ΔR_film.

According to an example, a 2D plane on which an x-axis represents SOH_EBS as a degradation parameter and a y-axis represents ΔR_film as a degradation parameter may be defined. For example, a boundary line 910 for distinguishing between a normal range and an abnormal range of a battery state may be defined on the 2D plane. For example, the boundary line 910 may correspond to the boundary line 440 of FIG. 4 or the boundary line 701 of FIG. 7.

In an example, if a target value 901 (e.g., a first value of a first degradation parameter) of SOH_EBS is "0.94", a minimum normal value 920 of ΔR_film for the target value 901 may be determined. For example, if the target value 901 is a value of the x-axis, the minimum normal value 920 of ΔR_film may be a value of the y-axis that satisfies an equation representing the boundary line 910. Based on the minimum normal value 920, values of ΔR_film may be divided into an abnormal range 922 and a normal range 924. If a value (e.g., a second value of a second degradation parameter) of ΔR_film is less than the minimum normal value 920, that is, is a value within the abnormal range 922, an internal short circuit may be determined to occur in a battery.

In another example, if a target value 902 (e.g., the first value of the first degradation parameter) of ΔR_film is "0.007", a minimum normal value 930 of SOH_EBS may be determined for the target value 902. For example, if the target value 902 is a value of the y-axis, the minimum normal value 930 of SOH_EBS may be a value of the x-axis that satisfies the equation representing the boundary line 910. Based on the minimum normal value 930, values of SOH_EBS may be divided into an abnormal range 932 and a normal range 934. If a value (e.g., the second value of the second degradation parameter) of SOH_EBS is less than the minimum normal value 930, that is, is a value within the abnormal range 932, the internal short circuit may be determined to occur in the battery.

Figure 10:
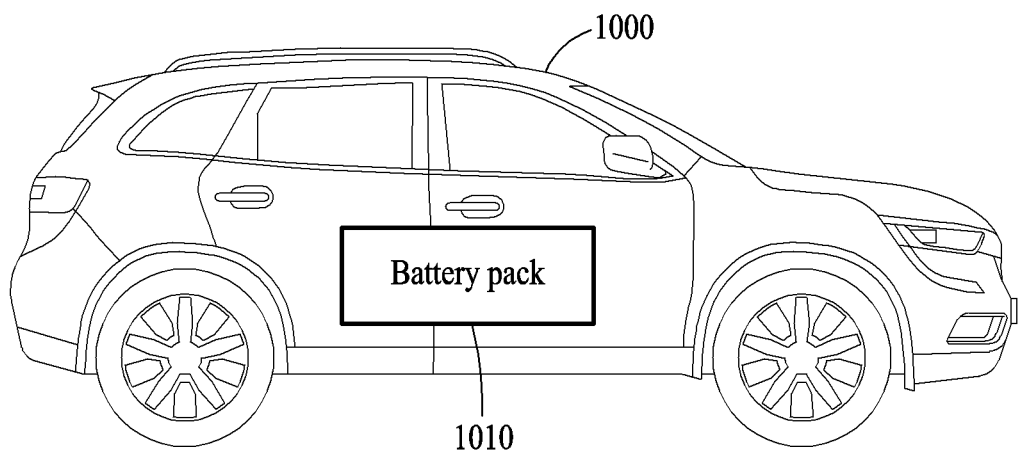
FIG. 10 illustrates an example of a vehicle.

FIG. 10 illustrates an example of a vehicle.

Referring to FIG. 10, a vehicle 1000 may include a battery pack 1010. The vehicle 1000 may be a vehicle that uses the battery pack 1010 as a power source. The vehicle 1000 may be, for example, an electric vehicle, a smart vehicle, an autonomous vehicle, or a hybrid vehicle.

The battery pack 1010 may include a BMS and battery cells (or battery modules). The BMS may include a memory, a processor, and a communication interface (not shown). As a non-limiting example, these memory, processor, and communication interface of the BMS may correspond to the memory 530, processor 520, and communicator 510 of FIG. 5. Thus, the above description may not be repeated here.

A sensor of the vehicle 1000 or the BMS may acquire values of one or more basic parameters of a battery. For example, the basic parameters may include one or more of a voltage of the battery, a current supplied by the battery, and a temperature of the battery.

The BMS may monitor whether an abnormality occurs in the battery pack 1010, and may prevent the battery pack 1010 from being over-charged or over-discharged. Further, if a temperature of the battery pack 1010 exceeds a first temperature (e.g., 40° C.) or is less than a second temperature (e.g., −10° C.), the BMS may perform a thermal control on the battery pack 1010. Also, the BMS may perform cell balancing to equalize charging states between battery cells in the battery pack 1010.

According to an example, the BMS of the battery pack 1010 may monitor whether an internal short circuit occurs in the battery cells. In an example, the BMS may perform a preset operation in response to the internal short circuit occurring in the battery. According to an example, the preset operation may be an operation of outputting a preset message or signal.

According to an example, the BMS may output the preset message through a display or audio system of the vehicle 1000, or be sent to an electronic control unit (ECU) or a vehicle control unit (VCU) of the vehicle 1000. In an example, the ECU or VCU of the vehicle 1000 may output the preset message through a display of the vehicle 1000.

In an example, if it is determined that a short circuit occurs in the battery pack 1010, the BMS may suspend charging or discharging of the battery pack 1010, and the VCU may notify a user of the state of the battery pack 1010. In another example, if it is determined that a short circuit occurs in the battery pack 1010, the BMS may control charging or discharging of the battery pack 1010 based on a level of the short circuit.

The description provided with reference to FIGS. 1 through 9 may be applicable to the description provided with reference to FIG. 10, and thus further description is not repeated herein.

Figure 11:
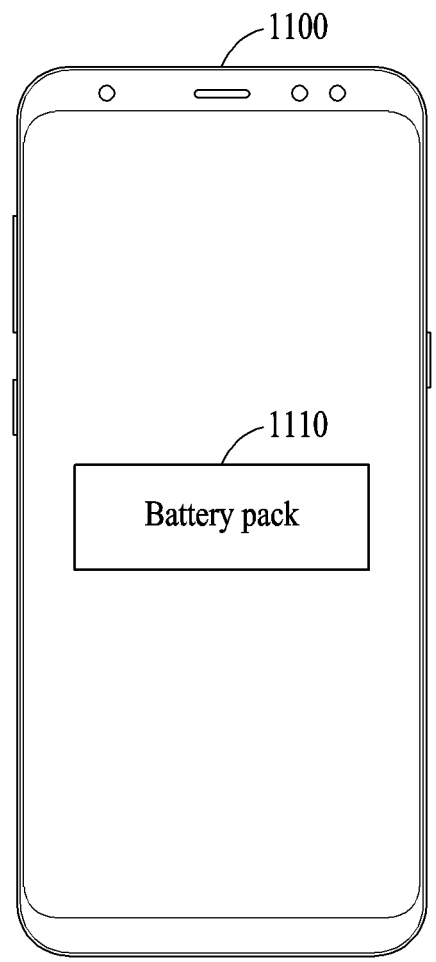
FIG. 11 illustrates an example of a mobile terminal.

FIG. 11 illustrates an example of a mobile terminal.

Referring to FIG. 11, a mobile terminal 1100 may include a battery pack 1110. The mobile terminal 1100 may be a device that uses the battery pack 1110 as a power source. In an example, the mobile terminal 1100 may be a wearable device, smart home device, or a portable terminal, for example, a smartphone. The battery pack 1110 may include a BMS and battery cells (or battery modules).

According to an example, the BMS of the battery pack 1110 may monitor whether an internal short circuit occurs in the battery cells.

The description provided with reference to FIGS. 1 through 9 may be applicable to the description provided with reference to FIG. 11, and thus further description is not repeated herein.

The electronic device 500, and other devices, apparatuses, units, modules, and components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an application-specific integrated circuit (ASIC), a field programmable gate array (FPGA), a programmable logic unit (PLU), a central processing unit (CPU), a graphics processing unit (GPU), a neural processing unit (NPU), or any other device capable of responding to and executing instructions in a defined manner.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In an example, the instructions or software includes at least one of an applet, a dynamic link library (DLL), middleware, firmware, a device driver, an application program storing the method of detecting an internal short circuit in a battery. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), magnetic RAM (MRAM), spin-transfer torque (STT)-MRAM, static random-access memory (SRAM), thyristor RAM (T-RAM), zero capacitor RAM (Z-RAM), twin transistor RAM (TTRAM), conductive bridging RAM (CBRAM), ferroelectric RAM (FeRAM), phase change RAM (PRAM), resistive RAM (RRAM), nanotube RRAM, polymer RAM (PoRAM), nano floating gate Memory (NFGM), holographic memory, molecular electronic memory device), insulator resistance change memory, dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions. In an example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A processor-implemented method of detecting an internal short circuit in a battery, the method comprising:
    acquiring values of one or more basic parameters of the battery;
    acquiring values of one or more degradation parameters used in a battery model indicating an internal state of the battery based on the values of the one or more basic parameters;
    determining whether the internal short circuit occurs in the battery based on a first value of a first degradation parameter and a second value of a second degradation parameter from among the one or more degradation parameters; and
    performing an operation in response to the internal short circuit occurring in the battery,
    wherein the determining of whether the internal short circuit occurs in the battery comprises:
    determining a normal range of a value of the second degradation parameter with respect to the first value of the first degradation parameter;
    determining whether the second value of the second degradation parameter is a value within the normal range; and
    determining that the internal short circuit occurs in the battery in response to the second value of the second degradation parameter not being the value within the normal range.

2. The method of claim 1, wherein the basic parameters comprise any one or any combination of a voltage of the battery, a current supplied by the battery, and a temperature of the battery.

3. The method of claim 1, wherein the battery model comprises an electro-chemical model or an equivalent-circuit model to which the degradation parameters are applied.

4. The method of claim 1, wherein the degradation parameters comprise any one or any combination of an electrode balance shift, a capacity of a cathode active material, and a surface resistance of an anode.

5. The method of claim 1, wherein the internal state of the battery comprise any one or any combination of state of health (SOH), a state of charge (SOC), a cell voltage, a cathode lithium ion concentration distribution, an anode lithium ion concentration distribution, an electrolyte lithium ion concentration distribution, a cathode potential, and an anode potential of the battery.

6. The method of claim 1, wherein the first degradation parameter is an electrode balance shift, and the second degradation parameter is a surface resistance of an anode.

7. The method of claim 6, wherein the first value of the first degradation parameter is based on converting a value of the electrode balance shift into a state of health (SOH).

8. The method of claim 1, wherein the first degradation parameter is an electrode balance shift, and the second degradation parameter is a surface resistance of an anode.

9. The method of claim 1, wherein when the first degradation parameter is a surface resistance of an anode, and the second degradation parameter is an electrode balance shift.

10. The method of claim 1, wherein the determining of the normal range of the value of the second degradation parameter with respect to the first value of the first degradation parameter comprises determining a minimum normal value of the second degradation parameter with respect to the first value of the first degradation parameter.

11. The method of claim 10, wherein the determining of the minimum normal value of the second degradation parameter with respect to the first value of the first degradation parameter comprises determining a minimum normal value of the second degradation parameter based on a pre-generated table for a value of the first degradation parameter and a value of the second degradation parameter.

12. The method of claim 10, wherein the determining of the minimum normal value of the second degradation parameter with respect to the first value of the first degradation parameter comprises determining a minimum normal value of the second degradation parameter based on a pre-defined equation for a value of the first degradation parameter and a value of the second degradation parameter.

13. The method of claim 12, wherein the pre-defined equation defines a boundary line between a normal range and an abnormal range of a battery state, and wherein the internal short circuit does not occur in the normal range, and the internal short circuit occurs in the normal range.

14. The method of claim 13, wherein the boundary line is based on a policy of controlling a charge and a discharge of the battery.

15. The method of claim 10, wherein the determining of whether the second value of the second degradation parameter is the value within the normal range comprises determining that the second value of the second degradation parameter is not the value within the normal range in response to the second value of the second degradation parameter being less than the minimum normal value of the second degradation parameter.

16. The method of claim 1, wherein the performing of the operation comprises outputting a message or signal, in response to the internal short circuit occurring in the battery.

17. The method of claim 1, wherein the battery is comprised in a mobile terminal.

18. The method of claim 1, wherein the battery is comprised in a vehicle.

19. A non-transitory computer-readable storage medium storing instructions that, when executed by a processor, cause the processor to perform the method of claim 1.

20. An electronic device for detecting an internal short circuit in a battery, the electronic device comprising:

a processor configured to
acquire values of one or more basic parameters of the battery;
acquire values of one or more degradation parameters used in a battery model indicating an internal state of the battery based on the values of the one or more basic parameters;
determine whether the internal short circuit occurs in the battery based on a first value of a first degradation parameter and a second value of a second degradation parameter from among the one or more degradation parameters; and
perform an operation in response to the internal short circuit occurring in the battery,
wherein, for the determining of whether the internal short circuit occurs in the battery, the processor is configured to:
determine a normal range of a value of the second degradation parameter with respect to the first value of the first degradation parameter;
determine whether the second value of the second degradation parameter is a value within the normal range; and
determine that the internal short circuit occurs in the battery in response to the second value of the second degradation parameter not being the value within the normal range.

21. A vehicle comprising:
a sensor configured to capture one or more basic parameters of a battery;
a processor configured to execute instructions stored in a non-transitory computer-readable storage medium to configure the processor to
acquire the one or more basic parameters from the sensor,
acquire values of one or more degradation parameters used in a battery model indicating an internal state of the battery based on the values of the one or more basic parameters,
determine whether an internal short circuit occurs in the battery based on a first value of a first degradation parameter and a second value of a second degradation parameter from among the one or more degradation parameters, and
output a message to a vehicle control unit (VCU) of the vehicle, in response to the internal short circuit occurring in the battery,
wherein, for the determining of whether the internal short circuit occurs in the battery, the processor is configured to:
determine a normal range of a value of the second degradation parameter with respect to the first value of the first degradation parameter;
determine whether the second value of the second degradation parameter is a value within the normal range; and
determine that the internal short circuit occurs in the battery in response to the second value of the second degradation parameter not being the value within the normal range.

22. The vehicle of claim 21, wherein the processor is further configured to suspend charging or discharging of the battery and the VCU is further configured to notify a user, in response to the internal short circuit occurring in the battery.

23. The vehicle of claim 21, wherein the processor is further configured to control charging or discharging of the battery based on a level of the internal short circuit, in response to the internal short circuit occurring in the battery.

* * * * *